United States Patent
Gumann et al.

(10) Patent No.: US 11,349,060 B2
(45) Date of Patent: May 31, 2022

(54) DIELECTRIC HOLDER FOR QUANTUM DEVICES

(71) Applicant: International Business Machines Corporation, Armonk, NY (US)

(72) Inventors: Patryk Gumann, Tarrytown, NY (US); Salvatore Bernardo Olivadese, Stamford, CT (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 224 days.

(21) Appl. No.: 16/905,519

(22) Filed: Jun. 18, 2020

(65) Prior Publication Data

US 2020/0357975 A1    Nov. 12, 2020

Related U.S. Application Data

(62) Division of application No. 16/173,720, filed on Oct. 29, 2018, now Pat. No. 10,784,431.

(51) Int. Cl.

| H01L 29/06 | (2006.01) |
|---|---|
| H01L 39/04 | (2006.01) |
| H01L 27/18 | (2006.01) |
| H01L 39/02 | (2006.01) |
| G06N 10/00 | (2022.01) |
| H01L 39/24 | (2006.01) |

(52) U.S. Cl.
CPC ............ *H01L 39/045* (2013.01); *H01L 27/18* (2013.01); *H01L 39/025* (2013.01); *G06N 10/00* (2019.01); *H01L 39/2493* (2013.01)

(58) Field of Classification Search
CPC ..... H01L 39/045; H01L 27/18; H01L 39/025; H01L 39/2493; G06N 10/00
See application file for complete search history.

(56) References Cited

U.S. PATENT DOCUMENTS

2017/0061317 A1*    3/2017    Chow ................... H01L 39/045

OTHER PUBLICATIONS

List of all related IBM dockets, 2020.

* cited by examiner

*Primary Examiner* — Samuel A Gebremariam
(74) *Attorney, Agent, or Firm* — Garg Law Firm, PLLC; Rakesh Garg; Erik Johnson

(57) ABSTRACT

A device includes a first substrate formed of a first material that exhibits a threshold level of thermal conductivity. The threshold level of thermal conductivity is achieved at a cryogenic temperature range in which a quantum circuit operates. In an embodiment, the device also includes a second substrate disposed in a recess of the first substrate, the second substrate formed of a second material that exhibits a second threshold level of thermal conductivity. The second threshold level of thermal conductivity is achieved at a cryogenic temperature range in which a quantum circuit operates. In an embodiment, at least one qubit is disposed on the second substrate. In an embodiment, the device also includes a transmission line configured to carry a microwave signal between the first substrate and the second substrate.

20 Claims, 6 Drawing Sheets

DIELECTRIC HOLDER FOR QUANTUM DEVICES

TECHNICAL FIELD

The present invention relates generally to a device, a fabrication method, and computer program product for layout of quantum devices. More particularly, the present invention relates to a device, a fabrication method, and computer program product for a dielectric holder for quantum devices.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing. A quantum device uses a set of quantum circuits to perform computational tasks. For example, a quantum device can include at least two quantum circuits, each quantum circuit including at least one qubit.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

The presently available superconducting quantum circuits are formed using materials that become superconducting at cryogenically low temperatures, e.g., at about 10-100 millikelvin (mK), or about 4 K. For example, presently available superconducting quantum circuits can be formed using Silicon or Sapphire as a substrate. The presently available superconducting quantum circuits are disposed in a housing in a dilution fridge stage. The electronic circuits that are used to control, operate, and measure the quantum circuits are usually located outside the dilution fridge that houses the superconducting quantum circuit. The temperature outside the fridge is usually about 300 K (room temperature).

The presently available dilution fridges are cryogenic apparatus which can be used to cool down samples/devices to millikelvin temperatures. However, the transition from room temperature to millikelvin temperatures inside the fridge is not sudden or abrupt. To facilitate the temperature transition and the cooling operation, the dilution fridge consists of multiple thermally-isolated stages (compactly referred to herein as "stage", plural "stages") held at different ambient temperatures. For example, common commercial dilution fridges have 5 temperature-stages inside the fridge 40 K, 4 K, 0.7 K, 0.1 K, 0.01 K (also known as the base stage). To simplify the discussion, we focus below on the input lines inside the fridge. To maintain the temperature difference between the different stages inside the fridge and to protect the quantum circuits from noise coming down the input lines, which originates from room-temperature electronics or blackbody radiation of higher stages or other sources of electromagnetic noise, it is common practice to use lossy transmission lines to connect between two consecutive stages and to incorporate resistive attenuators and filters in the path of these lines at the different stages.

A signal propagating on a line between stages can contain hot electrons, electrons containing more energy as a result of being located outside the fridges at room temperature. Hot electrons can bring thermal noise into the stages. This noise can be in the infrared spectrum.

A signal on a line passing through a stage can contain noise. This noise can be in the microwave frequency spectrum. For the reasons described herein, microwave frequency noise is undesirable when the line and signals relate to quantum computing using q-circuits.

The illustrative embodiments recognize certain disadvantages with the presently available quantum circuits. For example, each qubit requires about one square millimeter of space on a substrate to operate. The illustrative embodiments recognize that the size of presently available substrates restrict the number of qubits and connections between qubits that allow a quantum device to operate. The illustrative embodiments further recognize that thermalization of quantum devices reduces noise in signals.

SUMMARY

The illustrative embodiments provide a device, fabrication system, and computer program product for a dielectric holder for quantum devices. A device of an embodiment includes a first substrate formed of a first material that exhibits a threshold level of thermal conductivity. In an embodiment, the threshold level of thermal conductivity is achieved at a cryogenic temperature range in which a quantum circuit operates.

In an embodiment, the device also includes a second substrate disposed in a recess of the first substrate, the second substrate formed of a second material that exhibits a second threshold level of thermal conductivity. In an embodiment, the second threshold level of thermal conductivity is achieved at a cryogenic temperature range in which a quantum circuit operates.

In an embodiment, at least one qubit is disposed on the second substrate. In an embodiment, the device also includes a transmission line configured to carry a microwave signal between the first substrate and the second substrate.

In an embodiment, the device includes a third substrate disposed in a second recess of the first substrate, the third substrate formed of a third material that exhibits a third threshold level of thermal conductivity. In an embodiment, the third threshold level of thermal conductivity is achieved at a cryogenic temperature range in which a quantum circuit operates. In an embodiment, at least one qubit is disposed on the third substrate.

In an embodiment, the device includes a second transmission line configured to carry a second microwave signal between the at least one qubit on the third substrate and the at least one qubit on the second substrate.

In an embodiment, the substrate is milled to form the recess. In an embodiment, the milling is performed by a laser mill. In an embodiment, a depth of the recess is in a range between 200 and 700 micrometers, inclusive of each end of the range.

In an embodiment, the substrate is etched to form the recess. In an embodiment, the first material comprises at least one of sapphire, silicon, quartz, gallium arsenide, fused silica, amorphous silicon, or diamond.

In an embodiment, the second material comprises at least one of sapphire, silicon, quartz, gallium arsenide, fused silica, amorphous silicon, or diamond.

In an embodiment, a top surface of the second substrate is substantially flush with a top surface of the first substrate. In an embodiment, a depth of the recess is about 200 micrometers.

In an embodiment, the device includes a third substrate disposed in a recess of the second substrate, the third substrate formed of a third material that exhibits a third threshold level of thermal conductivity. In an embodiment, the third threshold level of thermal conductivity is achieved at a cryogenic temperature range in which a quantum circuit operates. In an embodiment, at least one qubit is disposed on the third substrate.

In an embodiment, the third substrate is substantially flush with a top surface of the first substrate.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

An embodiment includes a fabrication system. The fabrication system performs operations including forming a recess in a first substrate, the first substrate formed of a first material that exhibits a threshold level of thermal conductivity, wherein the threshold level of thermal conductivity is achieved at a cryogenic temperature range in which a quantum circuit operates.

In an embodiment, the fabrication system performs operations including placing a second substrate in the recess of the first substrate, the second substrate formed of a second material that exhibits a second threshold level of thermal conductivity, wherein the second threshold level of thermal conductivity is achieved at a cryogenic temperature range in which a quantum circuit operates, and wherein at least one qubit is disposed on the second substrate.

In an embodiment, the fabrication system performs operations including connecting a transmission line configured to carry a microwave signal between the first substrate and the second substrate.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
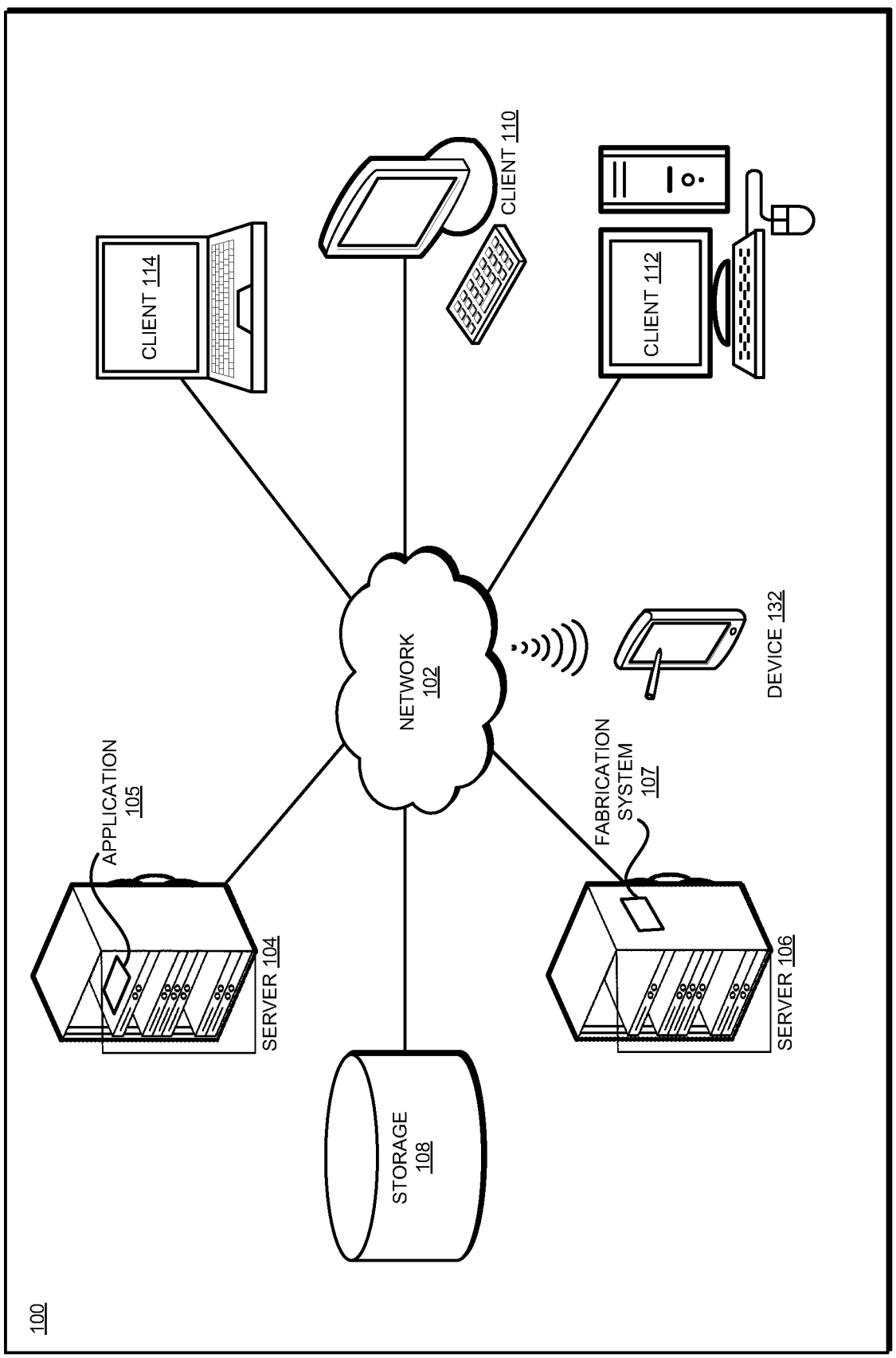
FIG. 1 depicts a block diagram of a network of data processing systems in accordance with an illustrative embodiment.

The illustrative embodiments used to describe the invention generally address and solve the above-described needs for layout of quantum devices. The illustrative embodiments provide a dielectric holder for quantum devices.

An operation described herein as occurring with respect to a frequency of frequencies should be interpreted as occurring with respect to a signal of that frequency or frequencies. All references to a "signal" are references to a microwave signal unless expressly distinguished where used.

An embodiment provides a device for a dielectric holder for quantum devices. Another embodiment provides a fabrication method for the device, such that the method can be implemented as a software application. The application implementing a fabrication method embodiment can be configured to operate in conjunction with an existing fabrication system—such as a lithography system, or a circuit assembly system.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein.

Furthermore, some compositions, dilutions, temperatures, thicknesses, depths, and other measurements are described herein only as non-limiting examples. Some of these described measurements have been used in experimentations related to certain inventive aspects described herein, and are usable in a preferred embodiment. However, these examples of measurements are not intended to be limiting. From this disclosure, those of ordinary skill in the art will be able to conceive many other variations of the measurements, such as different compositions, dilutions, temperatures, thicknesses, or depths, to achieve similar or comparable results as an embodiment, and such variations are contemplated within the scope of the illustrative embodiments.

Furthermore, a simplified diagram of an example quantum device substrate is used in the figures and the illustrative embodiments. In an actual fabrication of a quantum device, additional structures that are not shown or described herein may be present, without departing the scope of the illustrative embodiments. Similarly, within the scope of the illustrative embodiments, a shown or described structure layer may be fabricated or implemented differently to yield a similar operation or result as described herein.

Differently shaded portions in the two-dimensional drawings are intended to represent different materials unless expressly described differently where used. The different materials may be replaced with other materials that are known to those of ordinary skill in the art as having a similar property as the described material.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in an actual operation according to the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
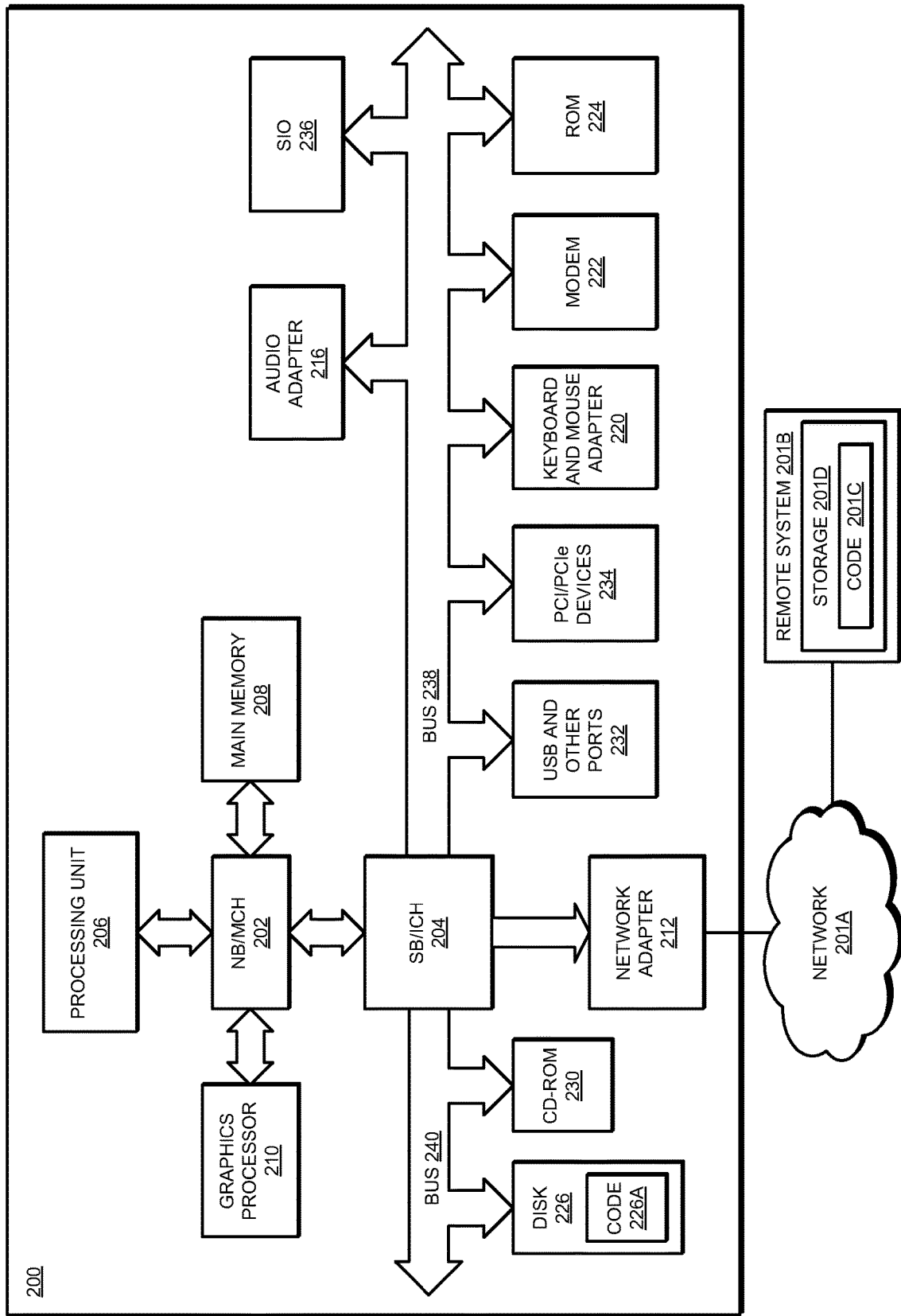
FIG. 2 depicts a block diagram of a data processing system in accordance with an illustrative embodiment.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a device. Application 105 provides instructions to system 107 for a fabrication process in a manner described herein.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs memory controller hub (NB/MCH) 202 and input/output (I/O) controller hub (SB/ICH) 204. Processing unit 206, main memory 208, and graphics processor 210 are coupled in the example manner shown in this figure. Local area network (LAN) adapter 212, audio adapter 216, keyboard and mouse adapter 220, modem 222, read only memory (ROM) 224, universal serial bus (USB) and other ports 232, and PCI/PCIe devices 234 are coupled through bus 238. Hard disk drive (HDD) or solid-state drive (SSD) 226 and CD-ROM 230 are coupled through bus 240. A super I/O (SIO) device 236 may be coupled through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

Instructions for applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

Figure 3:
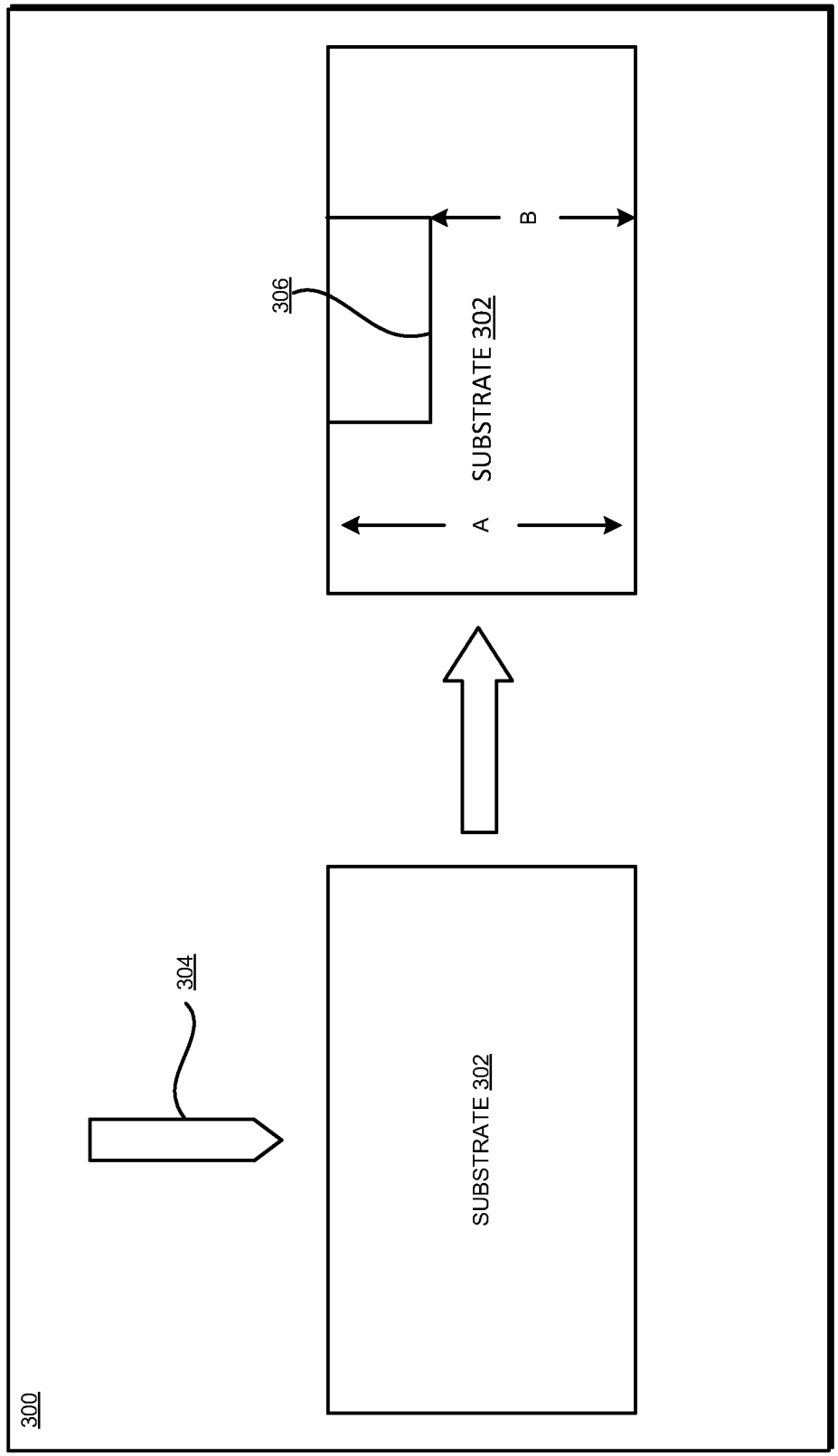
FIG. 3 depicts a block diagram of an example quantum device configuration in accordance with an illustrative embodiment.

With reference to FIG. 3, this figure depicts a block diagram of an example quantum device configuration in accordance with an illustrative embodiment. Application 105 in FIG. 1 interacts with fabrication system 107 to produce or manipulate configuration 300 as described herein.

Configuration 300 depicts substrate 302. Substrate 302 comprises a material with high thermal conductivity (above a threshold) in the cryogenic temperature range. In an embodiment, substrate 302 is formed using a material that exhibits a Residual Resistance Ratio (RRR) of at least 100, and a thermal conductivity of greater than a 1 W/(cm*K) at 10 milliKelvin, threshold level of thermal conductivity. RRR is the ratio of the resistivity of a material at room temperature and at 0 K. Because 0 K cannot be reached in practice, an approximation at 10 mK is used. For example, substrate 302 may be formed using sapphire, silicon, quartz, gallium arsenide, fused silica, amorphous silicon, or diamond for operations in the temperature range of 77 K to 0.01 K. These examples of substrate materials are not intended to be limiting. From this disclosure, those of ordinary skill in the art will be able to conceive of many other materials suitable for forming the substrate and the same are contemplated within the scope of the illustrative embodiments.

An embodiment causes a fabrication system, such as fabrication system 107 in FIG. 1, to form a recess 306 in the substrate 302. For example, milling device 306 can be configured to form recess 306 in the substrate 302. In an embodiment, the depth, A, of the substrate 302 is about 700 micrometers. In an embodiment, the depth, B, of the recess 306 is about the same as depth A. In an embodiment, the recess 306 extends to a depth of about 200 to 700 micrometers through the substrate 302, inclusive of both ends of the range. In an embodiment, the depth of the recess 306 extends completely through the substrate 302.

In an embodiment, recess 306 is formed in the substrate 302 by a milling device. For example, milling device 306 can be a micro-milling device with diamond milling bits or laser mill. These examples of milling devices are not intended to be limiting. From this disclosure, those of ordinary skill in the art will be able to conceive of many other milling devices suitable for forming a recess in a substrate and the same are contemplated within the scope of the illustrative embodiments. Furthermore, from this disclosure those of ordinary skill in the art will be able to conceive of many other devices and methods suitable for forming a recess in the substrate and the same are contemplated within the scope of the illustrative embodiments. For example, a Si substrate can be etched using a solution, such as a Hydrofluoric acid solution, to form a recess in the substrate.

Figure 4:
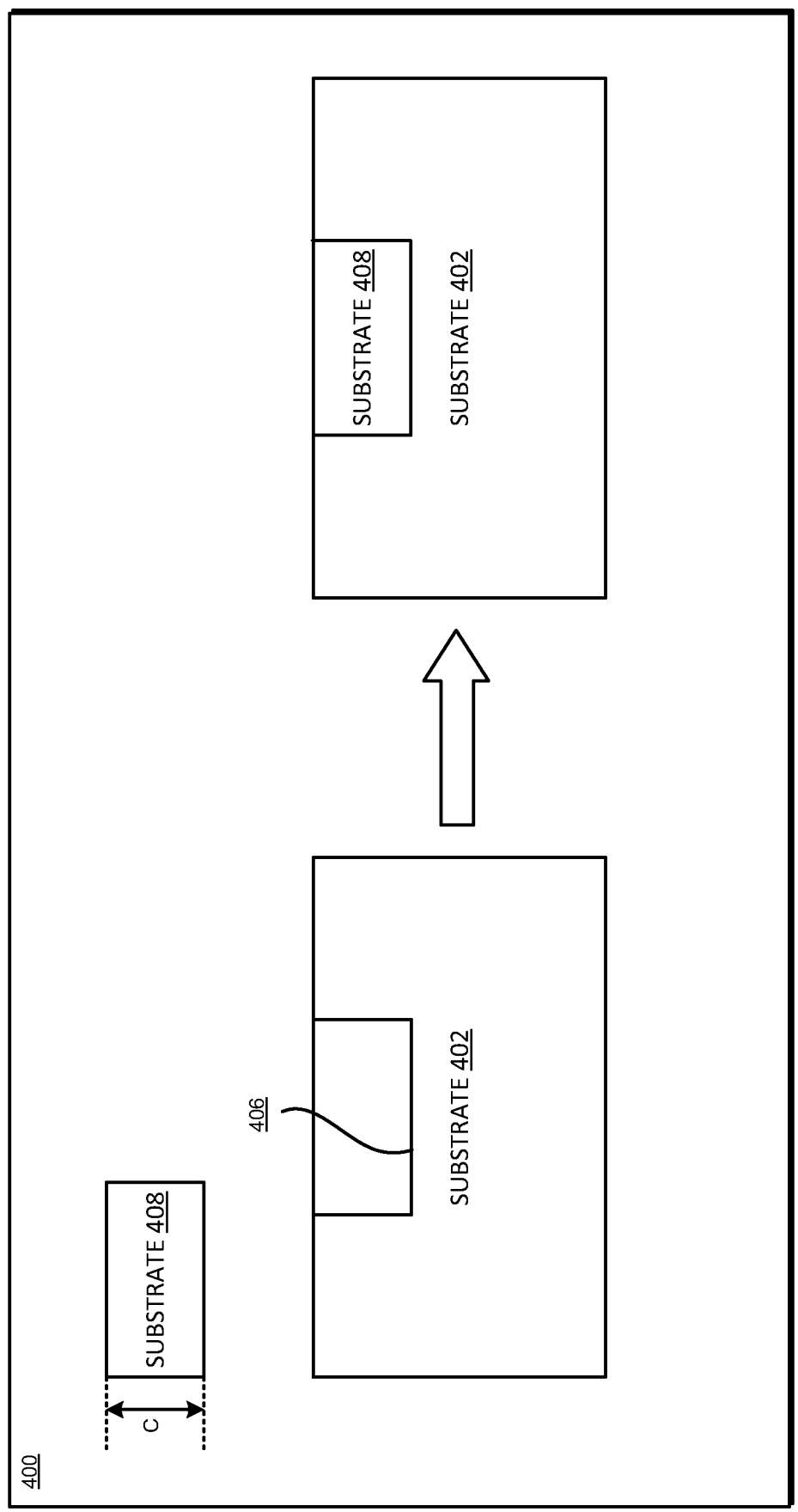
FIG. 4 depicts a block diagram of an example quantum device configuration in accordance with an illustrative embodiment.

With reference to FIG. 4, this figure depicts a block diagram of an example quantum device configuration in accordance with an illustrative embodiment. Application 105 in FIG. 1 interacts with fabrication system 107 to produce or manipulate configuration 400 as described herein.

An embodiment causes the fabrication system to place substrate 408 into recess 406. Substrate 408 comprises material with high thermal conductivity (above a threshold) in the cryogenic temperature range. In an embodiment, substrate 408 is formed using a material that exhibits a Residual Resistance Ratio (RRR) of at least 100, and a thermal conductivity of greater than a 1 W/(cm*K) at 10 milliKelvin, threshold level of thermal conductivity. RRR is the ratio of the resistivity of a material at room temperature and at 0 K. Because 0 K cannot be reached in practice, an approximation at 10 mK is used. For example, substrate 408 may be formed using sapphire, silicon, quartz, gallium arsenide, fused silica, amorphous silicon, or diamond for operations in the temperature range of 77 K to 0.01 K. These examples of substrate materials are not intended to be limiting. From this disclosure, those of ordinary skill in the art will be able to conceive of many other materials suitable for forming the substrate and the same are contemplated within the scope of the illustrative embodiments.

In an embodiment, a top surface of substrate 408 is substantially flush with a top surface of substrate 402. For example, a depth, C, of substrate 408 can be within about five percent of a depth of the recess 406 such that the majority of the substrate 408 fits within recess 406.

In an embodiment, application 105 in FIG. 1 interacts with fabrication system 107 to form a recess in substrate 408 and place a substrate in the recess of substrate 408. These examples of forming recesses and placing substrates are not intended to be limiting. From this disclosure, those of ordinary skill in the art will be able to conceive of many other processes suitable for forming recesses in a first substrate and placing a subsequent substrate in the formed recess and the same are contemplated within the scope of the illustrative embodiments.

Figure 5:
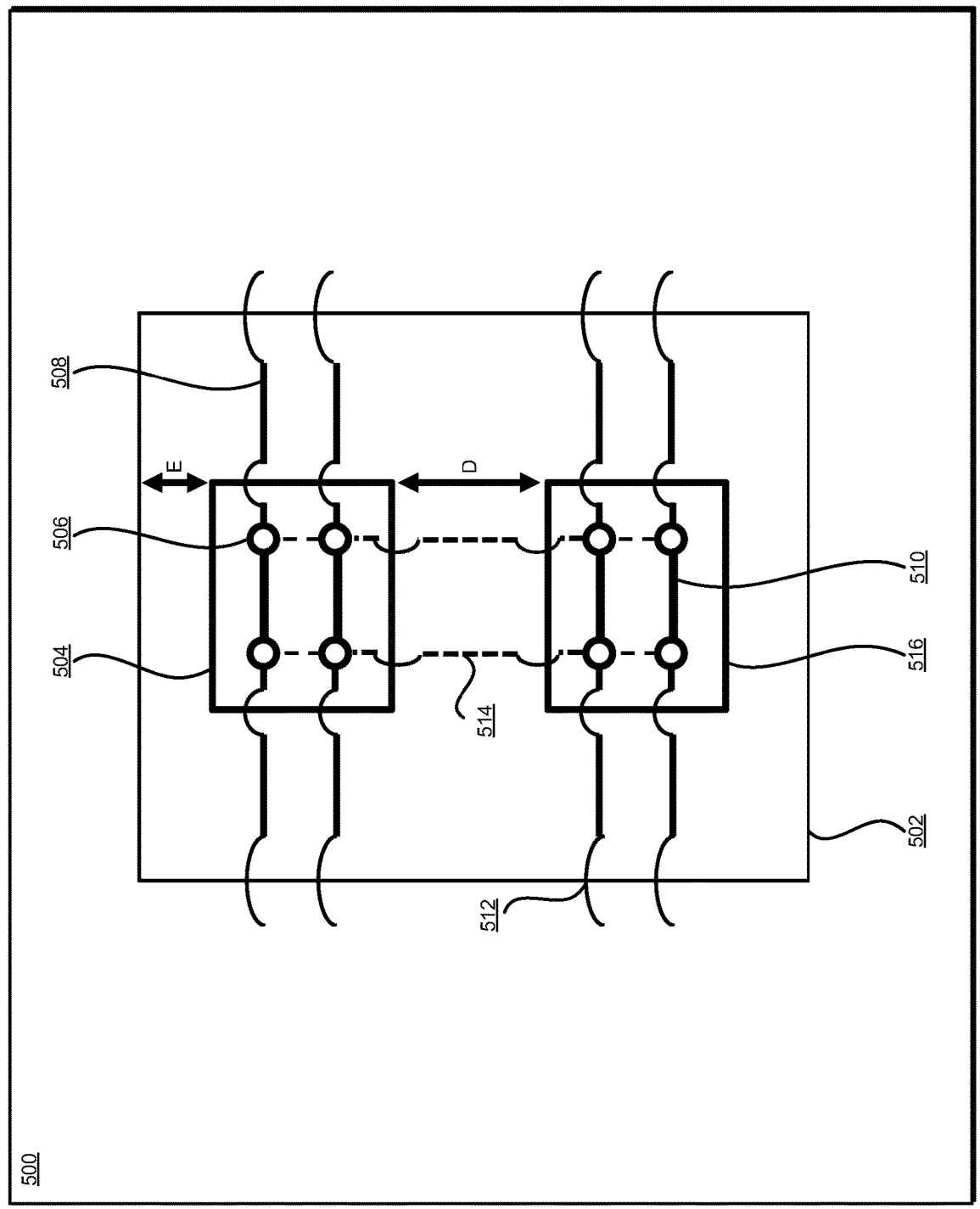
FIG. 5 depicts a block diagram of an example quantum device configuration in accordance with an illustrative embodiment.

With reference to FIG. 5, this figure depicts a block diagram of an example quantum device configuration in accordance with an illustrative embodiment. Application 105 in FIG. 1 interacts with fabrication system 107 to produce or manipulate configuration 500 as described herein.

An embodiment causes the fabrication system to place wirebonds 512 and transmission lines 508, 510 on the first substrate 502 and the second substrate 504. Second substrate 504 comprises a set of qubits 506. Transmission lines 508 and wirebonds 512 are configured to carry microwave signals between the first substrate 502 and the second substrate 504. In an embodiment, transmission lines 510 and wirebonds 512 carry microwave signals from the qubits 506 to a readout circuit.

In an embodiment, substrate 502 is about twelve millimeters in width and ten millimeters in height. In an embodiment, a set of substrates are placed in an array pattern on substrate 502. For example, substrates 504, 516 can be placed in corresponding recesses in the substrate 502. In an embodiment, additional substrates can be placed in substrate 504. For example, a process similar to the process of FIGS. 3 and 4 can form a recess in substrate 504.

In an embodiment, application 105 in FIG. 1 interacts with fabrication system 107 to form a recess in substrate 504 and place a subsequent substrate in the recess of substrate 504. These examples of forming recesses and placing substrates are not intended to be limiting. From this disclosure, those of ordinary skill in the art will be able to conceive of many other processes suitable for forming recesses in a first substrate and placing a subsequent substrate in the formed recess and the same are contemplated within the scope of the illustrative embodiments.

Transmission lines 510 are configured to carry microwave signals between qubits 506. Transmission lines 514 are configured to carry microwave signals between qubits on different substrates. For example, transmission lines 514 can carry microwave signals between qubits 506 on substrate 504 and qubits on substrate 516. Each substrate 504, 516 is disposed in a corresponding recess in substrate 502. Substrates 504, 516 are spaced apart from each other on the substrate 502. For example, substrates 504, 516 can be spaced apart by a distance, D, of about 2 millimeters. In an embodiment, substrates 504, 516, are spaced about from an edge of the substrate 502. For example, substrate 504 can be spaced apart from an edge of the substrate 502 by a distance, E, of about 1 millimeter. These examples of distances and connections are not intended to be limiting. From this disclosure, those of ordinary skill in the art will be able to conceive of many other materials suitable for forming the substrate and the same are contemplated within the scope of the illustrative embodiments. For example, connections on a substrate or between substrates can be formed by air bridges.

Figure 6:
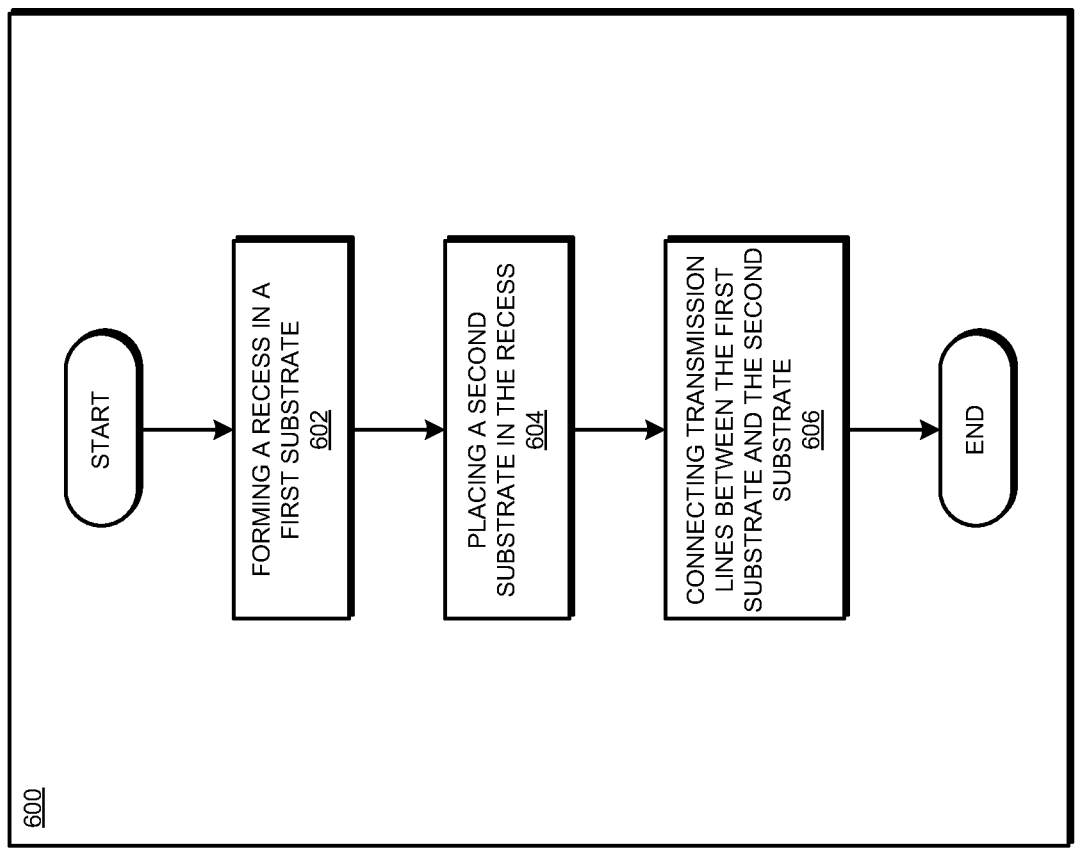
FIG. 6 depicts a flowchart of a fabrication process for a dielectric holder for quantum devices in accordance with an illustrative embodiment.

With reference to FIG. 6, this figure depicts a flowchart of a fabrication process for a dielectric holder for quantum devices in accordance with an illustrative embodiment. Process 600 can be implemented in application 105 in FIG. 1, to form a recess in a substrate and connect transmission lines as described with respect to FIGS. 3, 4, and 5.

The application causes a fabrication system to form a recess in a first substrate (block 602). The application causes a fabrication system to place a second substrate in the recess (block 604). The application causes a fabrication system to connect transmission lines between the first substrate and the second substrate (block 606). The application ends process 600 thereafter.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The present invention may be a system, a method, and/or a computer program product at any possible technical detail level of integration. The computer program product may include a computer readable storage medium (or media) having computer readable program instructions thereon for causing a conventional processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a conventional processor of a general purpose computer, special purpose computer, or other programmable data processing apparatus to produce a machine, such that the instructions, which execute via the conventional processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer usable program product comprising one or more computer-readable storage devices, and program instructions collectively stored on at least one of the one or more storage devices, the stored program instructions comprising:
    program instructions to form a recess in a first substrate, the first substrate formed of a first material that exhibits a threshold level of thermal conductivity, wherein the threshold level of thermal conductivity is achieved at a cryogenic temperature range in which a quantum circuit operates;
    program instructions to place a second substrate in the recess of the first substrate, the second substrate formed of a second material that exhibits a second threshold level of thermal conductivity, wherein the second threshold level of thermal conductivity is achieved at a cryogenic temperature range in which a quantum circuit operates, and wherein at least one qubit is disposed on the second substrate, and wherein the recess surrounds both side surfaces and a bottom surface of the second substrate, and wherein a top surface of the second substrate is substantially coplanar with a top surface of the first substrate; and
    program instructions to connect a transmission line configured to carry a microwave signal between the first substrate and the second substrate.

2. The computer usable program product of claim 1, the stored program instructions further comprising:
    program instructions to form a second recess in the first substrate; and
    program instructions to place a third substrate in the second recess of the first substrate, the third substrate formed of a third material that exhibits a third threshold level of thermal conductivity, wherein the third threshold level of thermal conductivity is achieved at a cryogenic temperature range in which a quantum circuit operates, and wherein at least one qubit is disposed on the third substrate.

3. The computer usable program product of claim 2, further comprising:
    program instructions to connect a second transmission line configured to carry a second microwave signal between the at least one qubit on the third substrate and the at least one qubit on the second substrate.

4. The computer usable program product of claim 2, wherein the third substrate is substantially flush with a top surface of the first substrate.

5. The computer usable program product of claim 1, program instructions to form recess in the first substrate further comprising:
    program instructions to mill the recess in the first substrate.

6. The computer usable program product of claim 5, wherein the program instructions to mill are configured for performing by a laser mill.

7. The computer usable program product of claim 1, wherein a depth of the recess is in a range between 200 and 700 micrometers, inclusive of each end of the range.

8. The computer usable program product of claim 1, wherein the program instructions to form the recess in the first substrate are configured to perform etching to form the recess.

9. The computer usable program product of claim 1, wherein the first material comprises at least one of sapphire, silicon, quartz, gallium arsenide, fused silica, amorphous silicon, or diamond.

10. The computer usable program product of claim 1, wherein the second material comprises at least one of sapphire, silicon, quartz, gallium arsenide, fused silica, amorphous silicon, or diamond.

11. The computer usable program product of claim 1, wherein a top surface of the second substrate is substantially flush with a top surface of the first substrate.

12. The computer usable program product of claim 1, wherein a depth of the recess is about 200 micrometers.

13. The computer usable program product of claim 1, wherein the computer usable code is stored in a computer readable storage device in a server data processing system, and wherein the computer usable code is downloaded over a network to a remote data processing system for use in a computer readable storage device associated with the remote data processing system.

14. The computer usable program product of claim 1, wherein the computer usable code is stored in a computer readable storage device in a data processing system, and wherein the computer usable code is transferred over a network from a remote data processing system.

15. A fabrication system performing operations comprising:
forming a recess in a first substrate, the first substrate formed of a first material that exhibits a threshold level of thermal conductivity, wherein the threshold level of thermal conductivity is achieved at a cryogenic temperature range in which a quantum circuit operates;
placing a second substrate in the recess of the first substrate, the second substrate formed of a second material that exhibits a second threshold level of thermal conductivity, wherein the second threshold level of thermal conductivity is achieved at a cryogenic temperature range in which a quantum circuit operates, and wherein at least one qubit is disposed on the second substrate, and wherein the recess surrounds both side surfaces and a bottom surface of the second substrate, and wherein a top surface of the second substrate is substantially coplanar with a top surface of the first substrate; and
connecting a transmission line configured to carry a microwave signal between the first substrate and the second substrate.

16. The fabrication system of claim 15, the operations further comprising:
forming a second recess in the first substrate; and
placing a third substrate in the second recess of the first substrate, the third substrate formed of a third material that exhibits a third threshold level of thermal conductivity, wherein the third threshold level of thermal conductivity is achieved at a cryogenic temperature range in which a quantum circuit operates, and wherein at least one qubit is disposed on the third substrate.

17. The fabrication system of claim 16, the operations further comprising:
connecting a second transmission line configured to carry a second microwave signal between the at least one qubit on the third substrate and the at least one qubit on the second substrate.

18. The fabrication system of claim 16, wherein the third substrate is substantially flush with a top surface of the first substrate.

19. The fabrication system of claim 15, the operations further comprising:
milling the recess in the first substrate.

20. A method comprising: forming a recess in a first substrate, the first substrate formed of a first material that exhibits a threshold level of thermal conductivity, wherein the threshold level of thermal conductivity is achieved at a cryogenic temperature range in which a quantum circuit operates;
placing a second substrate in the recess of the first substrate, the second substrate formed of a second material that exhibits a second threshold level of thermal conductivity, wherein the second threshold level of thermal conductivity is achieved at a cryogenic temperature range in which a quantum circuit operates, and wherein at least one qubit is disposed on the second substrate, and wherein the recess surrounds both side surfaces and a bottom surface of the second substrate, and wherein a top surface of the second substrate is substantially coplanar with a top surface of the first substrate; and
connecting a transmission line configured to carry a microwave signal between the first substrate and the second substrate.

* * * * *